United States Patent
Yuan et al.

(10) Patent No.: US 7,109,757 B2
(45) Date of Patent: Sep. 19, 2006

(54) LEAKAGE-TOLERANT DYNAMIC WIDE-NOR CIRCUIT STRUCTURE

(75) Inventors: Xeujun Yuan, San Jose, CA (US); Ye Xiong, San Jose, CA (US); Peter F. Lai, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 66 days.

(21) Appl. No.: 10/990,140

(22) Filed: Nov. 15, 2004

(65) Prior Publication Data

US 2006/0103430 A1    May 18, 2006

(51) Int. Cl.
*H03K 19/096* (2006.01)

(52) U.S. Cl. ............................ 326/95; 326/98; 326/119

(58) Field of Classification Search ................. 326/95, 326/98, 112, 119, 121, 122; 365/203
See application file for complete search history.

(56) References Cited

U.S. PATENT DOCUMENTS

| | | | |
|---|---|---|---|
| 6,404,235 B1 | 6/2002 | Nowka et al. | 326/96 |
| 6,549,040 B1 | 4/2003 | Alvandpour et al. | 326/98 |
| 6,714,059 B1 | 3/2004 | Choe | 327/200 |
| 6,791,365 B1 | 9/2004 | Bosshart | 326/98 |
| 6,914,452 B1 * | 7/2005 | Gauthier et al. | 326/98 |
| 6,940,314 B1 | 9/2005 | Bloker et al. | 326/98 |
| 2004/0263208 A1 | 12/2004 | Levy et al. | 326/98 |

* cited by examiner

*Primary Examiner*—Daniel Chang
(74) *Attorney, Agent, or Firm*—Park, Vaughan & Fleming LLP

(57) ABSTRACT

One embodiment of the present invention provides a circuit which blocks a keeper from interfering with a dynamic node during an evaluation phase for a dynamic wide-NOR structure. The circuit contains a precharge device which is coupled to the dynamic node. The precharge device precharges the dynamic node during a precharge phase. The circuit also contains a plurality of parallel pull-down transistors which are coupled to the dynamic node. The pull-down transistors conditionally discharge the dynamic node during the evaluate phase. The keeper sustains a precharged value on the dynamic node, thereby preventing a false evaluation caused by a leakage current through the parallel pull-down transistors. In addition, the circuit contains a feedback gating device which is coupled between the keeper and the dynamic node. During the evaluation phase, the feedback gating device blocks the keeper, so that the parallel pull-down transistors can discharge the dynamic node without interference from the keeper.

21 Claims, 5 Drawing Sheets

LEAKAGE-TOLERANT DYNAMIC WIDE-NOR CIRCUIT STRUCTURE

BACKGROUND

1. Field of the Invention

The present invention relates to techniques for improving computer system performance. More specifically, the present invention relates to the design of a leakage-tolerant dynamic wide-NOR circuit structure.

2. Related Art

Designers use many arrangements of CMOS circuitry on a microprocessor chip. One common arrangement is a dynamic circuit. Dynamic circuits are beneficial because they provide reduced input capacitance and low switching thresholds, which results in increased switching speed. Moreover, the use of dynamic circuits leads to simple, area-efficient circuit layouts, which saves space on a semiconductor die. Unfortunately, due to their unique operating parameters, using dynamic circuits involves considering design complexities not encountered when using other types of CMOS circuits.

At the heart of the dynamic circuit is a dynamic node. Coupled to the dynamic node is a group of pull-down transistors that are arranged to perform a logic function for the dynamic gate. This group of pull-down transistors is coupled to $V_{ss}$ through an "evaluate" transistor. In addition, a "precharge" transistor is coupled between the dynamic node and $V_{cc}$.

The dynamic circuit functions in two phases; a "precharge" phase and an "evaluate" phase. During the precharge phase, the evaluate transistor is disabled and the precharge transistor charges the dynamic node to $V_{cc}$. Next, in the evaluate phase, the precharge transistor is disabled and the evaluate transistor is enabled. If the proper combination of inputs to the pull-down transistors is active during the evaluate phase, the pull-down transistors discharge the dynamic node to $V_{ss}$ through the evaluate transistor. Alternatively, if the proper combination of inputs is not active, the dynamic node remains in the precharged state.

One problem for dynamic circuits is "leakage current." Leakage current is current that flows under the gate of a transistor despite the fact that the transistor is not "turned on." As transistor gates become progressively narrower with each generation of process improvement, leakage current increases. Consequently, on chips that use the latest generation of transistors, the leakage current in dynamic circuits with multiple parallel pull-down transistors is large enough to discharge the dynamic node during the evaluate phase, thereby causing a "false evaluation."

One way to prevent leakage current from causing a false evaluation is to use a "keeper" circuit to sustain the precharged value on the dynamic node. To be effective, the keeper must be large enough to deliver the current necessary to counterbalance the effects of leakage current. Therefore, the keeper must increase in size as the leakage current increases. Consequently, a dynamic circuit that has a large leakage current, such as a dynamic circuit with multiple parallel pull-down transistors, the keeper must be very large. In such a circuit, when only a limited number of pull-down transistors is active during the evaluate phase, the very large keeper can overwhelm the pull-down transistors and prevent the proper discharge of the dynamic node.

To avoid dynamic circuits with very large keepers, designers have optimized the circuits to minimize leakage current. In dynamic circuits with multiple parallel pull-down transistors, designers have minimized the leakage current by decreasing the number of pull-down transistors coupled to the dynamic node. For example, memory array designs have been reduced from 512 pull-down transistors to 128 pull-down transistors. Unfortunately, with each reduction in the number of pull-down transistors, the circuit becomes less useful. As leakage current continues to increase, designers will have to continue reducing the number of pull-down transistors coupled to the dynamic node, further limiting the usefulness of these circuits.

Hence, what is needed is a dynamic circuit with multiple parallel pull-down transistors that is tolerant of leakage current.

SUMMARY

One embodiment of the present invention provides a circuit which blocks a keeper from interfering with a dynamic node during an evaluation phase for a dynamic wide-NOR structure. The circuit contains a precharge device which is coupled to the dynamic node. The precharge device precharges the dynamic node during a precharge phase. The circuit also contains a plurality of parallel pull-down transistors which are coupled to the dynamic node. The pull-down transistors conditionally discharge the dynamic node during the evaluate phase. The keeper sustains a precharged value on the dynamic node, thereby preventing a false evaluation caused by a leakage current through the parallel pull-down transistors. In addition, the circuit contains a feedback gating device which is coupled between the keeper and the dynamic node. During the evaluation phase, the feedback gating device blocks the keeper, so that the parallel pull-down transistors can discharge the dynamic node without interference from the keeper.

In a variation of this embodiment, the circuit contains a narrow pulse generator which generates a feedback control signal for the feedback gating device.

In a further variation, at the beginning of the evaluate phase the feedback gating device is disabled by the feedback control signal for a pre-determined time interval.

In a further variation, the pre-determined time interval is long enough to allow the parallel pull-down transistors to conditionally discharge the dynamic node, but short enough to prevent the leakage current from causing a false evaluation of the dynamic node.

In a variation of this embodiment, the feedback gating device can be a PMOS transistor, a switch, or a device which prevents the keeper from sustaining the precharged value on the dynamic node.

In a variation of this embodiment, the keeper is comprised of a feed-forward inverter coupled with a feedback PMOS device.

In a variation of this embodiment, the keeper is comprised of a feed-forward sense-amp coupled with a feedback PMOS device.

In a variation of this embodiment, the circuit with the dynamic wide-NOR structure is part of a memory array or a wide domino-NOR gate.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Leakage Current

A small sub-threshold or "leakage" current flows under the gate of a MOS transistor despite the fact that the transistor is inactive. This leakage current is related to the width of the gate in the transistor. As the gate gets narrower, the leakage current increases. In fact, in circuits comprised of transistors with very narrow gates, the leakage current can be large enough to disrupt the operation of a circuit. For example, in a dynamic circuit structure with multiple parallel pull-down transistors, such as a wide domino-NOR gate, the leakage current through the pull-down transistors is large enough to discharge the dynamic node during the evaluate phase, thereby causing a "false evaluation."

A Wide Domino-NOR Circuit with a Weak Keeper

Figure 1A:
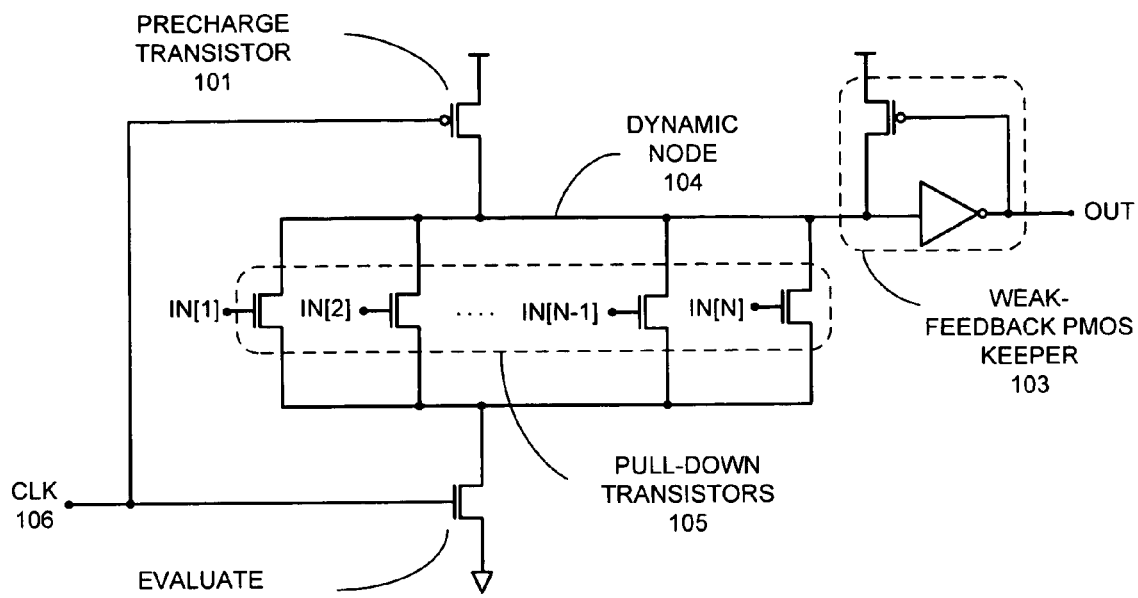
FIG. 1A illustrates a wide domino-NOR circuit with a weak-feedback PMOS keeper in accordance with an embodiment of the present invention.

FIG. 1A illustrates a wide domino-NOR circuit with a weak-feedback PMOS keeper 103 in accordance with an embodiment of the present invention. The wide domino-NOR circuit is composed of precharge transistor 101, pull-down transistors 105, and weak-feedback PMOS keeper 103, all of which are coupled to dynamic node 104. In addition, evaluate transistor 102 is coupled between pull-down transistors 105 and $V_{ss}$.

The wide domino-NOR circuit is controlled by CLK 106. When CLK 106 goes low, the wide domino-NOR circuit enters a precharge phase. In the precharge phase, precharge transistor 101 charges dynamic node 104 to $V_{cc}$. When CLK 106 goes high, the wide domino-NOR circuit enters an evaluate phase. In the evaluate phase, evaluate transistor 102 activates, allowing pull-down transistors 105 to conditionally discharge dynamic node 104.

During the evaluate phase, weak-feedback PMOS keeper 103 sustains the precharged value on dynamic node 104, preventing the leakage current through pull-down transistors 105 from discharging dynamic node 104. Hence, weak-feedback PMOS keeper 103 interferes with pull-down transistors 105 while pull-down transistors 105 are discharging dynamic node 104. To prevent weak-feedback PMOS keeper 103 from overwhelming pull-down transistors 105 (thereby incorrectly sustaining the precharged value on dynamic node 104), the feedback transistor in weak-feedback PMOS keeper 103 is kept as small as possible.

For purposes of this illustration, the feedback transistor in weak-feedback PMOS keeper 103 is small. Hence, weak-feedback PMOS keeper 103 can only sustain the precharged value on dynamic node with a small number of parallel pull-down transistors.

Figure 1B:
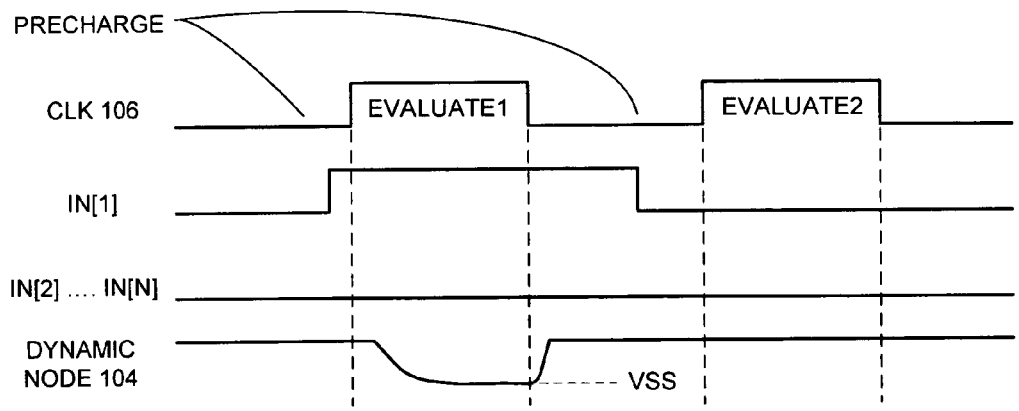
FIG. 1B presents a timing diagram for the wide domino-NOR circuit illustrated in FIG. 1A in accordance with an embodiment of the present invention.

FIG. 1B presents a timing diagram for the wide domino-NOR circuit illustrated in FIG. 1A in accordance with an embodiment of the present invention. The CLK 106, IN[1], and IN[2] . . . IN[N] waveforms represent the inputs to the circuit and the dynamic node 104 waveform represents the corresponding response on dynamic node 104.

When entering EVALUATE1, CLK 106 goes high, disabling precharge transistor 101 and enabling evaluate transistor 102. IN[1] is also high, enabling a pull-down transistor. Because the PMOS transistor in weak-feedback PMOS keeper 103 is very small, the single active pull-down transistor overwhelms the keeper and discharges dynamic node 104.

Upon entering EVALUATE2, CLK 106 again goes high, which disables precharge transistor 101 and enables evaluate transistor 102. During EVALUATE2, there are no active input signals; therefore there are no active pull-down devices. Consequently, weak-feedback PMOS keeper 103 sustains the precharged value on dynamic node 104, preventing leakage current from discharging the node.

A Wide Domino-NOR Circuit with a Moderate Keeper

Figure 2A:
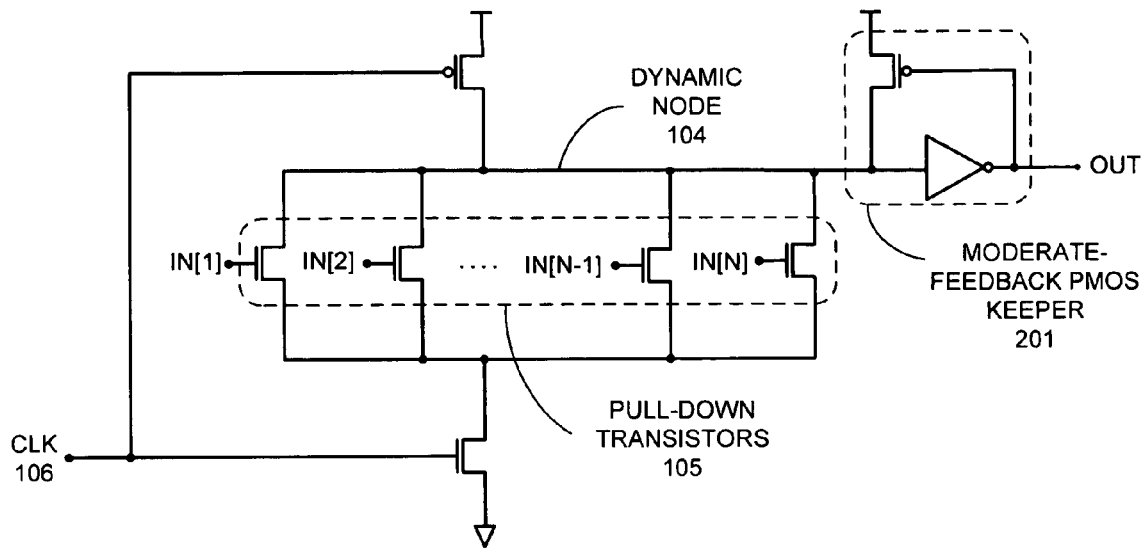
FIG. 2A illustrates a wide domino-NOR circuit with a moderately sized feedback PMOS keeper in accordance with an embodiment of the present invention.

FIG. 2A illustrates a wide domino-NOR circuit with a moderately sized feedback PMOS keeper 201 in accordance with an embodiment of the present invention.

For the purposes of this illustration, the feedback transistor in moderate feedback PMOS keeper 201 is mid-sized. Hence, moderate feedback PMOS keeper 201 is strong enough to counterbalance the leakage currents in a circuit structure with a several parallel pull-down transistors, but too weak to sustain the precharged value on a dynamic node with a large number of parallel pull-down transistors.

Figure 2B:
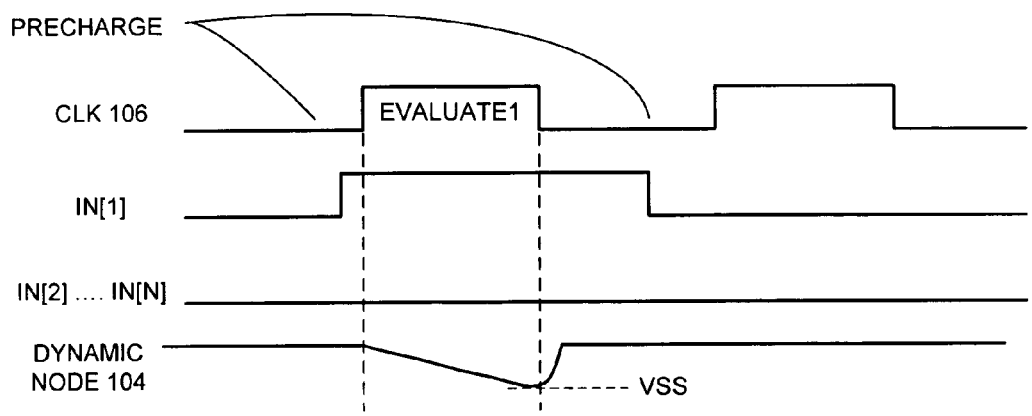
FIG. 2B presents a timing diagram for the wide domino-NOR circuit illustrated in FIG. 2A in accordance with an embodiment of the present invention.

FIG. 2B presents a timing diagram for the wide domino-NOR circuit illustrated in FIG. 2A in accordance with an embodiment of the present invention. The CLK 106, IN[1], and IN[2] . . . IN[N] waveforms represent the inputs to the circuit and the dynamic node 104 waveform represents the corresponding response on dynamic node 104.

When entering EVALUATE1, CLK 106 goes high, disabling the precharge transistor and enabling the evaluate transistor. IN[1] is also high, enabling a pull-down transistor. Due to the interference from moderate feedback PMOS keeper 201, the single pull-down transistor discharges dynamic node 104 slowly. Dynamic node 104 barely reaches $V_{ss}$ before the end of EVALUATE1. If pull-down transistors 105 were to require any more time to discharge dynamic node 104, the wide domino-NOR circuit can not evaluate properly.

A Wide Domino-NOR Circuit with a Strong Keeper

Figure 3A:
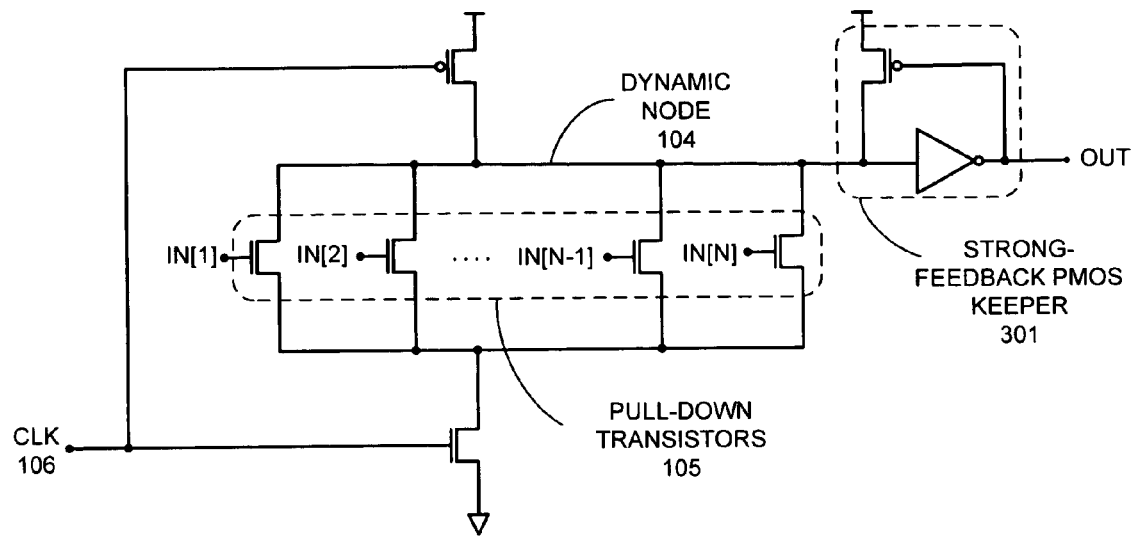
FIG. 3A illustrates a wide domino-NOR circuit with a strong-feedback PMOS keeper in accordance with an embodiment of the present invention.

FIG. 3A illustrates a wide domino-NOR circuit with strong-feedback PMOS keeper 301 in accordance with an embodiment of the present invention.

For the purposes of this illustration, the feedback transistor in strong-feedback PMOS keeper 301 is large. Hence, strong-feedback PMOS keeper 301 is strong enough to counterbalance the leakage currents in a circuit structure with a large number of parallel pull-down transistors.

Figure 3B:
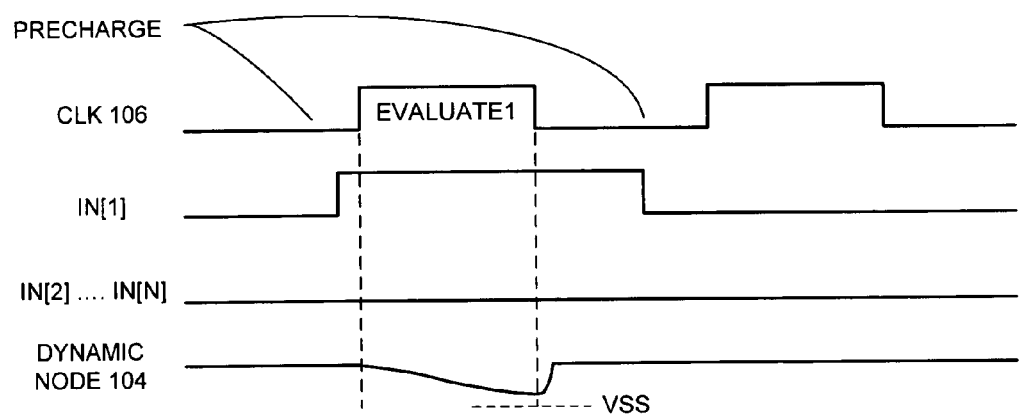
FIG. 3B presents a timing diagram for the wide domino-NOR circuit illustrated in FIG. 3A in accordance with an embodiment of the present invention.

FIG. 3B presents a timing diagram for the wide domino-NOR circuit illustrated in FIG. 3A in accordance with an embodiment of the present invention. The CLK 106, IN[1], and IN[2] . . . IN[N] waveforms represent the inputs to the circuit and the dynamic node 104 waveform represents the corresponding response on dynamic node 104.

When entering EVALUATE1, CLK 106 goes high, disabling the precharge transistor and enabling the evaluate transistor. IN[1] is also high, enabling a pull-down transistor. Due to the interference from strong-feedback PMOS keeper 301, the single pull-down transistor discharges dynamic node 104 extremely slowly. Dynamic node 104 fails to reach $V_{ss}$ before the end of EVALUATE1 and the wide domino-NOR circuit does not properly evaluate.

A Wide Domino-NOR Circuit with a Strong Keeper and a Gating Device

Figure 4A:
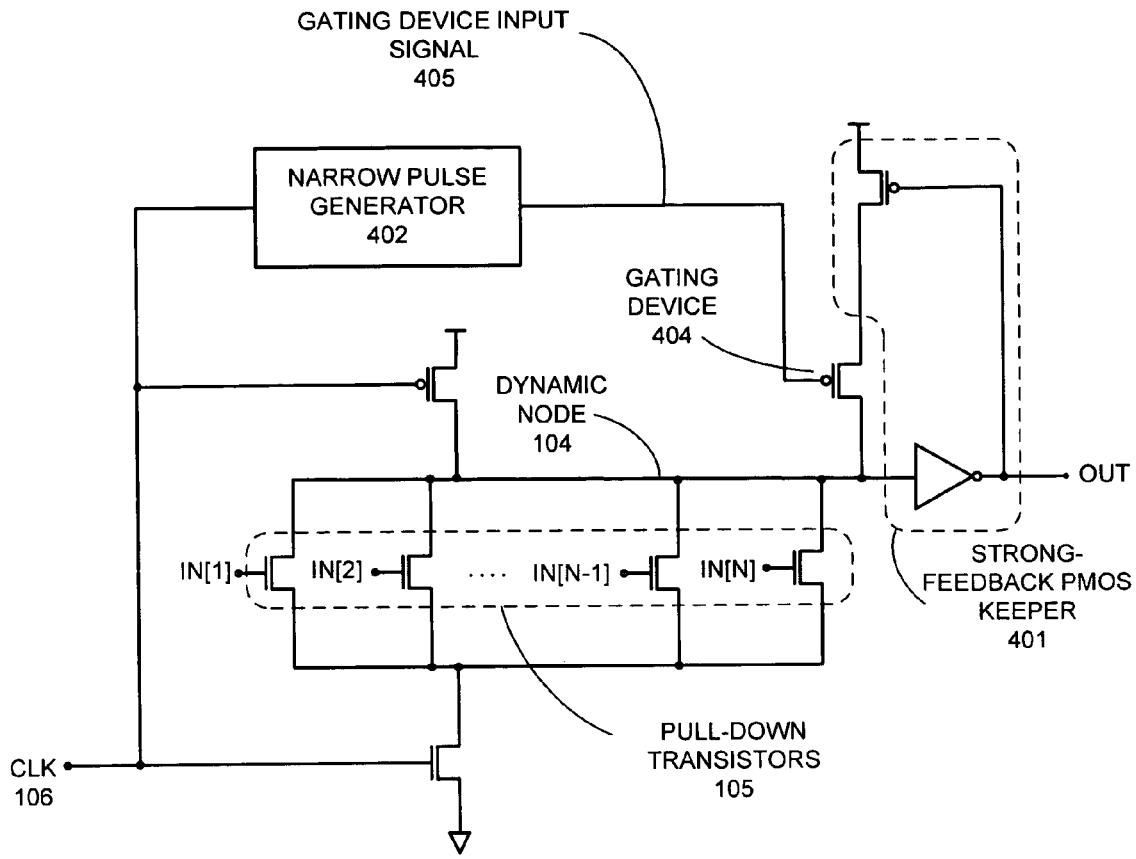
FIG. 4A illustrates a wide domino-NOR circuit with strong-feedback PMOS keeper, narrow pulse generator, and feedback gating device in accordance with an embodiment of the present invention.

FIG. 4A illustrates a wide domino-NOR circuit with strong-feedback PMOS keeper 401, narrow pulse generator 402, and feedback gating device 404 in accordance with an embodiment of the present invention.

For purposes of this illustration, strong-feedback PMOS keeper 401 is strong enough to counterbalance the leakage currents in a circuit structure with a large number of parallel pull-down transistors. Hence, strong-feedback PMOS keeper 401 is strong enough to overwhelm a single pull-down transistor and prevent dynamic node 104 from properly discharging during the evaluate phase (see FIG. 3A–3B for an illustration of this effect).

Strong feedback PMOS keeper 401 is electrically coupled to dynamic node 104 through gating device 404. When gating device 404 is active, strong-feedback PMOS keeper 401 sustains the precharged value on dynamic node 104. Alternatively, when gating device 404 is inactive, the electrical connection between dynamic node 104 and strong-feedback PMOS keeper 401 is interrupted. With the connection interrupted, strong feedback PMOS keeper 401 no longer sustains the precharged value on dynamic node 104, allowing pull-down transistors 105 to conditionally discharge dynamic node 104 without interference from strong-feedback PMOS keeper 401.

Narrow pulse generator 402 creates gating device input signal 405 from CLK 106. Gating device input signal 405 is the control signal for gating device 404. Note that at the beginning of each evaluate phase, narrow pulse generator 402 outputs a rising pulse on gating device input signal 405 that deactivates gating device 404 for a pre-defined interval of time.

Figure 4B:
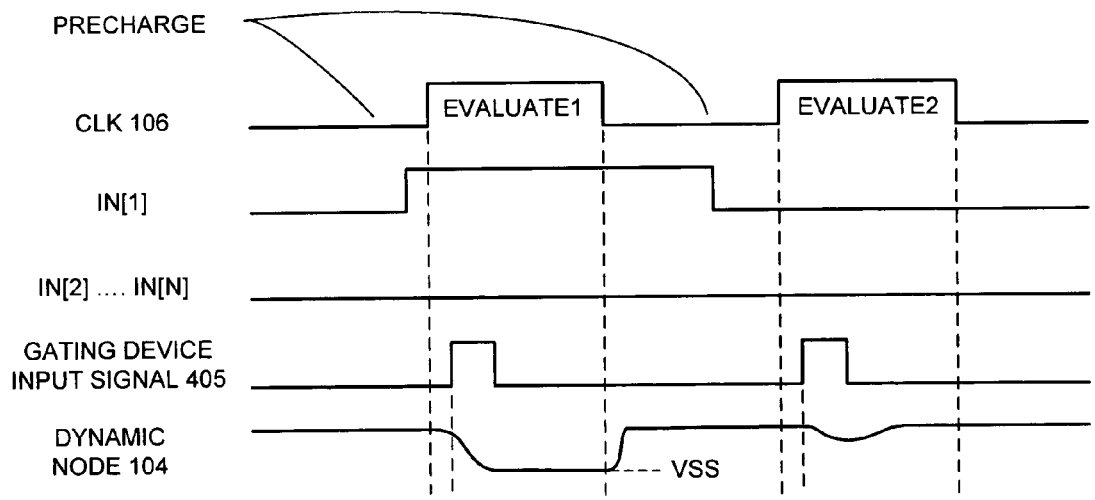
FIG. 4B presents a timing diagram for the wide domino-NOR circuit illustrated in FIG. 4A in accordance with an embodiment of the present invention.

FIG. 4B presents a timing diagram for the wide domino-NOR circuit illustrated in FIG. 4A in accordance with an embodiment of the present invention. The CLK 106, IN[1], and IN[2] . . . IN[N] waveforms represent the inputs to the circuit and the dynamic node 104 and gating device input signal 405 waveforms represents the corresponding responses on dynamic node 104 and gating device input signal 405.

When entering EVALUATE1, CLK 106 goes high, disabling the precharge transistor and enabling the evaluate transistor. IN[1] is also high, thereby enabling one pull-down transistor.

At the beginning of EVALUATE1, strong-feedback PMOS keeper overwhelms the single active pull-down transistor, preventing the proper discharge of dynamic node 104. However, once gating device input signal 405 deactivates gating device 404 (blocking strong-feedback PMOS keeper 401), dynamic node 104 begins to discharge. Since there is no longer any interference from strong-feedback PMOS keeper 401 on dynamic node 104, the single active pull-down transistor quickly discharges dynamic node 104. By the time gating device input signal 405 reactivates gating device 404 (unblocking strong feedback PMOS keeper 401), dynamic node 104 is completely discharged.

Note that as dynamic node 104 discharges, the feed-forward inverter of strong-feedback PMOS keeper 401 switches from driving a low signal to driving a high signal to the feedback PMOS transistor. The high signal deactivates the feedback PMOS transistor, thereby disabling strong feedback PMOS keeper 401. Therefore, even though strong feedback PMOS keeper 401 is unblocked when gating device 404 is reactivated, strong feedback PMOS keeper 401 does not affect the state of dynamic node 104 for the rest of EVALUATE1.

When entering EVALUATE2, CLK 106 again goes high, disabling the precharge transistor and enabling the evaluate transistor. There are no active input signals; therefore there are no active pull-down transistors. Consequently, strong-feedback PMOS keeper 401 must sustain the precharged value on dynamic node 104 against the leakage current through pull-down transistors 105.

When gating device input signal 405 goes high in EVALUATE2, gating device 404 deactivates, blocking strong-feedback PMOS keeper 401. Consequently, the leakage current through pull-down transistors 105 begins to discharge dynamic node 104. The leakage current is large enough to completely drain dynamic node 104 while the wide domino-NOR is in EVALUATE2. However, gating device input signal 405 goes low a short time later, re-enabling gating device 404 and removing the block on strong-feedback PMOS keeper 401. Strong-feedback PMOS keeper 401 therefore restores dynamic node 104 to the precharged value.

In summary, gating device input signal 405 must be held high long enough to allow the discharge of dynamic node 104 when only one pull-down transistor is active, but must not be held high for so long that the leakage current can discharge dynamic node 104 when all the pull-down transistors are inactive.

A Narrow Pulse Generator

Figure 5A:
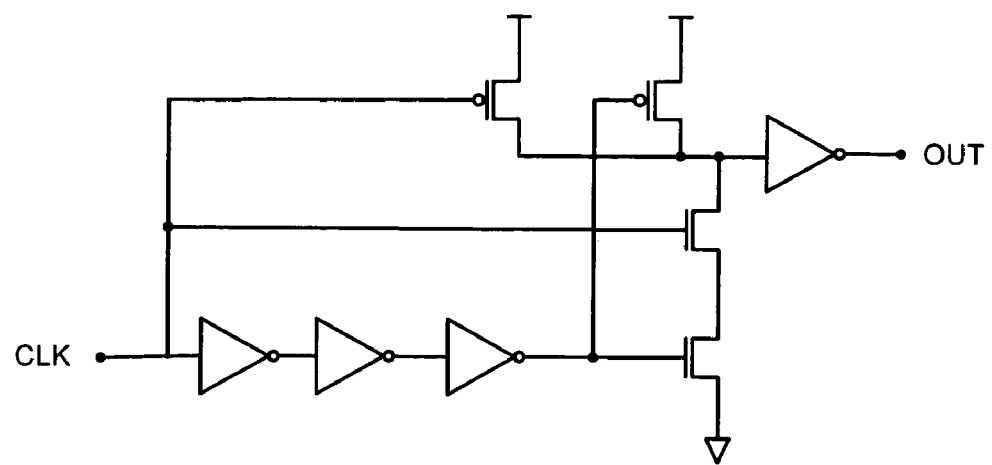
FIG. 5A illustrates a circuit design for the narrow pulse generator in accordance with an embodiment of the present invention.

FIG. 5A illustrates a circuit design for the narrow pulse generator in accordance with an embodiment of the present invention. The narrow pulse generator is a specialized circuit which controls gating device 404 (see FIG. 4A).

Based on the input transitioning to a high state, the narrow pulse generator outputs a rising pulse of limited duration. The duration of the rising pulse depends on the number of inversions on the delayed path (the path to the lowest NMOS transistor). Note that, in order to function properly, the circuit requires an odd number of inversions on the delayed path.

Figure 5B:
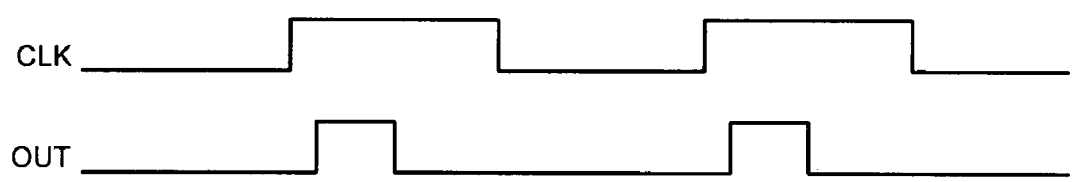
FIG. 5B presents a timing diagram for the narrow pulse generator illustrated in FIG. 5A in accordance with an embodiment of the present invention.

FIG. 5B presents a timing diagram for the narrow pulse generator illustrated in FIG. 5A in accordance with an embodiment of the present invention. Because the narrow pulse generator circuit has three stages in the delayed path, OUT rises 1 gate delay after CLK rises and falls 4 gate delays after CLK rises. Note that the falling edge of OUT can be delayed for different durations by changing the number of inversions in the delay leg.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit which blocks a keeper from interfering with a dynamic node during an evaluation phase for a dynamic wide-NOR structure, comprising:
   a precharge device which is coupled to the dynamic node, wherein the precharge device precharges the dynamic node during a precharge phase;
   a plurality of parallel pull-down transistors which are coupled to the dynamic node, wherein the pull-down transistors conditionally discharge the dynamic node during the evaluate phase;
   the keeper, which is configured to sustain a precharged value on the dynamic node, thereby preventing a false evaluation caused by a leakage current through the parallel pull-down transistors; and
   a feedback gating device which is coupled between the keeper and the dynamic node;
   a narrow pulse generator which generates a feedback control signal that controls the feedback gating device, wherein the feedback control signal is active for a predetermined time which is shorter than the active phase of an input to the narrow pulse generator; and
   wherein during the evaluation phase the feedback gating device blocks the keeper, so that the parallel pull-down transistors can discharge the dynamic node without interference from the keeper.

2. The circuit of claim 1, wherein at the beginning of the evaluate phase the feedback gating device is disabled by the feedback control signal for a predetermined time interval.

3. The circuit of claim 2, wherein the pre-determined time interval is long enough to allow the parallel pull-down transistors to conditionally discharge the dynamic node, but short enough to prevent the leakage current from causing a false evaluation of the dynamic node.

4. The circuit of claim 1, wherein the feedback gating device comprising
   a PMOS transistor;
   a switch; or
   a device which prevents the keeper from sustaining the precharged value on the dynamic node.

5. The circuit of claim 1, wherein the keeper is comprised of a feed-forward inverter coupled with a feedback PMOS device.

6. The circuit of claim 1, wherein the keeper is comprised of a feed-forward sense-amp coupled with a feedback PMOS device.

7. The circuit of claim 1, wherein the circuit with the dynamic wide-NOR structure is part of:
   a memory array; or a wide domino-NOR gate.

8. A method for blocking a keeper from interfering with a dynamic node during an evaluate phase for a dynamic wide-NOR structure, comprising:
   when a feedback gating device is activated, causing the keeper to sustain a precharged value on the dynamic node, thereby preventing a false evaluation caused by a leakage current through a group of inactive pull-down transistors during the evaluate phase;
   precharging the dynamic node during a precharge phase; and
   upon leaving the precharge phase and entering the evaluate phase,
      using a narrow pulse generator to generate a feedback control signal for the feedback gating device, wherein the feedback control signal is active for a predetermined time which is shorter than the active phase of an input to the narrow pulse generator;
      deactivating the feedback gating device, thereby preventing the keeper from sustaining the precharged value on the dynamic node, and
      conditionally discharging the dynamic node without interference from the keeper.

9. The method of claim 8, wherein at the beginning of the evaluate phase the feedback gating device is disabled by the feedback control signal for a pre-determined time interval.

10. The method of claim 9, wherein the pre-determined time interval is long enough to allow the parallel pull-down transistors to conditionally discharge the dynamic node, but short enough to prevent the leakage current from causing a false evaluation of the dynamic node.

11. The method of claim 8, wherein the feedback gating device comprising:
   a PMOS transistor;
   a switch; or
   a device which prevents the keeper from sustaining the precharged value on the dynamic node.

12. The method of claim 8, wherein the keeper is comprised of a feed-forward inverter coupled with a feedback PMOS device.

13. The method of claim 8, wherein the keeper is comprised of a feed-forward sense-amp coupled with a feedback PMOS device.

14. The method of claim 8, wherein the circuit with the dynamic wide-NOR structure is part of:
   a memory array; or
   a wide domino-NOR gate.

15. A computer system, comprising:
   a processor;
   a memory;
   a dynamic wide-NOR structure which blocks a keeper from interfering with a dynamic node during an evaluation phase;
   a precharge device which is coupled to the dynamic node, wherein the precharge device precharges the dynamic node during a precharge phase;
   the keeper, which is configured to sustain a precharged value on the dynamic node, thereby preventing a false evaluation caused by a leakage current through the parallel pull-down transistors;
   a plurality of parallel pull-down transistors which are coupled to the dynamic node, wherein the pull-down transistors conditionally discharge the dynamic node during the evaluate phase; and
   a feedback gating device which is coupled between the keeper and the dynamic node;
   a narrow pulse generator which generates a feedback control signal that controls the feedback gating device, wherein the feedback control signal is active for a predetermined time which is shorter than the active phase of an input to the narrow pulse generator; and
   wherein during the evaluation phase the feedback gating device blocks the keeper, so that the parallel pull-down transistors can discharge the dynamic node without interference from the keeper.

16. The computer system of claim 15, wherein at the beginning of the evaluate phase the feedback gating device is disabled by the feedback control signal for a pre-determined time interval.

17. The computer system of claim 16, wherein the pre-determined time interval is long enough to allow the parallel pull-down transistors to conditionally discharge the dynamic node, but short enough to prevent the leakage current from causing a false evaluation of the dynamic node.

18. The computer system of claim 15, wherein the feedback gating device comprising:
   a PMOS transistor;
   a switch; or
   a device which prevents the keeper from sustaining the precharged value on the dynamic node.

19. The computer system of claim 15, wherein the keeper is comprised of a feed-forward inverter coupled with a feedback PMOS device.

20. The computer system of claim 15, wherein the keeper is comprised of a feed-forward sense-amp coupled with a feedback PMOS device.

21. The computer system of claim 15, wherein the dynamic wide-NOR structure is part of:
   a memory array; or
   a wide domino-NOR gate.

* * * * *